US012699129B2

(12) United States Patent
Strasser et al.

(10) Patent No.: US 12,699,129 B2
(45) Date of Patent: Aug. 4, 2026

(54) PROBE FOR MEASURING A SIGNAL AND A REFERENCE SIGNAL AND METHOD OF MANUFACTURING A PROBE FOR MEASURING A SIGNAL AND A REFERENCE SIGNAL

(71) Applicant: Rohde & Schwarz GmbH & Co. KG, Munich (DE)

(72) Inventors: Franz Strasser, Munich (DE); Andreas Ziegler, Munich (DE); Stefan Ketzer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 191 days.

(21) Appl. No.: 18/631,874

(22) Filed: Apr. 10, 2024

(65) Prior Publication Data

US 2025/0321268 A1 Oct. 16, 2025

(51) Int. Cl.
*G01R 31/28* (2006.01)
*G01R 1/067* (2006.01)
*G01R 3/00* (2006.01)

(52) U.S. Cl.
CPC ..... *G01R 31/2889* (2013.01); *G01R 1/06722* (2013.01); *G01R 3/00* (2013.01); *G01R 31/2863* (2013.01)

(58) Field of Classification Search
CPC .. G01R 31/2889; G01R 1/06722; G01R 3/00; G01R 31/2863; G01R 1/06738; G01R 1/06772
USPC ...................................... 324/754.07
See application file for complete search history.

(56) References Cited

U.S. PATENT DOCUMENTS

| | | | | |
|---|---|---|---|---|
| 4,774,462 A | * | 9/1988 | Black ................. | G01R 1/07392 |
| | | | | 324/756.07 |
| 5,204,615 A | * | 4/1993 | Richards ........... | G01R 31/2805 |
| | | | | 324/755.05 |
| 5,218,293 A | * | 6/1993 | Kan ................... | G01R 1/06772 |
| | | | | 324/754.14 |
| 5,223,787 A | * | 6/1993 | Smith ................. | G01R 1/0416 |
| | | | | 439/482 |
| 5,559,446 A | * | 9/1996 | Sano .................... | G01R 1/0735 |
| | | | | 324/750.19 |
| 6,118,292 A | * | 9/2000 | Antonello .......... | G01R 31/2808 |
| | | | | 324/750.25 |
| 6,498,506 B1 | * | 12/2002 | Beckous ........... | G01R 1/06772 |
| | | | | 324/755.05 |

(Continued)

FOREIGN PATENT DOCUMENTS

| | | | | | |
|---|---|---|---|---|---|
| JP | | 2012181948 A | * | 9/2012 | |
| WO | | WO-2023287798 A1 | * | 1/2023 | ............. G01R 1/045 |

*Primary Examiner* — Christopher P Mcandrew
(74) *Attorney, Agent, or Firm* — CHRISTENSEN O'CONNOR JOHNSON KINDNESS PLLC

(57) ABSTRACT

Embodiments of the present disclosure relate to a probe for measuring a signal and a reference signal. The probe comprises a metal body that encompasses a reference socket. The reference socket is in electrical connection with the metal body for measuring the reference signal. The probe comprises a pin that is arranged electrically isolated from the metal body. The pin has an abutting surface capable of contacting a device under test. Further, embodiments of the present disclosure relate to a method of manufacturing a probe for measuring a signal and a reference signal.

18 Claims, 4 Drawing Sheets

(56)  References Cited

U.S. PATENT DOCUMENTS

| | | | | | |
|---|---|---|---|---|---|
| 6,563,332 | B2 * | 5/2003 | Goto | ................. | G01R 1/07371 |
| | | | | | 324/756.03 |
| 10,753,961 | B2 * | 8/2020 | Mende | ............... | G01R 1/06711 |
| 2004/0157493 | A1 * | 8/2004 | Bergner | ............ | H01R 13/6477 |
| | | | | | 439/607.41 |
| 2018/0328962 | A1 | 11/2018 | Mende et al. | | |

* cited by examiner

PROBE FOR MEASURING A SIGNAL AND A REFERENCE SIGNAL AND METHOD OF MANUFACTURING A PROBE FOR MEASURING A SIGNAL AND A REFERENCE SIGNAL

FIELD OF THE DISCLOSURE

Embodiments of the present disclosure relate to a probe for measuring a signal and a reference signal from a device under test, particularly a differential probe. Further, embodiments of the present disclosure also relate to a method of manufacturing a probe for measuring a signal and a reference signal.

BACKGROUND

In the state of the art, probes are known that are used for measuring a signal and a reference signal. These probes typically comprise a signal socket with a concavity for receiving a signal pin from a device under test as well as a reference contact for receiving a reference pin of the device under test. The signal and the reference signal are provided via the signal pin and the reference pin, respectively. The signal pin and the reference pin are clamped by the probe in order to ensure proper contact of the respective pins. The signal socket and the reference contact are electromagnetically shielded by a metal body, but electrically isolated from each other, thereby realizing a two-pole socket. Such a probe is described in US 2018/0 328 962 A1.

However, the probes known in the state of the art have some drawbacks since the contact interface of the device under test has to match with the interface of the probe, namely the signal socket and the reference contact, particularly their (relative) orientation and dimensions. If the contact interface of the device under test does not match with the interface of the probe, an adapter will be necessary that might introduce errors, resulting in less accurate measurement results. Particularly, input capacitances at a tip of the probe might differ, causing problems in case of performing common-mode rejection ratio (CMRR) measurements.

Moreover, shielding is more critical which also causes less accurate measurement results.

These drawbacks have to be overcome while realizing a cost-efficient probe that ensures accurate measurements.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a probe for measuring a signal and a reference signal. In an embodiment, the probe comprises a metal body that encompasses a reference socket. The reference socket is in electrical connection with the metal body for measuring the reference signal. The probe comprises a pin that is arranged electrically isolated from the metal body. The pin has an abutting surface capable of contacting a device under test. In an embodiment, a pin tip of a pin of the device under test is contacted by the abutting surface of the pin of the probe.

The main idea is to provide a pin with abutting surface instead of a signal socket for probing the device under test in order to receive the signal. In an embodiment, pins of a pin connector can be probed, wherein one pins of the pin connector interacts with the abutting surface. In an embodiment, the abutting surface contacts a pin tip of the device under test, e.g. a pin tip of the pin connector, so as to establish an electrical contact for receiving the signal. In an embodiment, a full contact or surface contact via the abutting surface of the pin is established with respect to the device under test, for example the pin tip of the device under test, such that a good electrical contact is ensured, resulting in accurate measurement results.

In an embodiment, the pin of the probe is located within the metal body such that the pin and its abutting surface is electromagnetically shielded by the metal body that acts as the shielding. The pin however is electrically isolated from the metal body, thereby ensuring that no short circuit occurs as the metal body is electrically connected with the reference socket.

The pin of the probe may also be called a contact pin as the pin is used for contacting the device under test when the device under test is probed by the probe.

Generally, the probe is a manually operated probe. Thus, the probe is held by a human operator during testing as the operator manually contacts the device under test, e.g. certain portions of interest of the device under test like pins.

In an embodiment, the probe may relate to a differential probe. In an embodiment, the probe is a high-voltage (differential) probe that is capable of measuring signals with voltages above 250 V, e.g. up to several thousand volt.

An aspect provides, for example, that the pin is movably located in the probe such that the pin has an initial state and a pushed state into which the pin is pushed. The pin is pushed into the pushed state when the device under test is probed by the probe, namely when the abutting surface contacts the device under test, for instance the pin tip of the device under test, e.g. the pin tip of the pin connector of the device under test. This ensures that an even contact via the abutting surface can be realized such that a good electrical contact is obtained. The pin is movably located, thereby ensuring that another pin of the device under test can be inserted into the reference socket simultaneously. The pin of the probe is moved in a defined manner so as to ensure proper contact via the abutting surface when the pin moves. In an embodiment, the pin is moved by the part of the device under test that is contacted via the abutting surface when the device under test is probed. In other words, a passive movement of the pin takes place.

For instance, the abutting surface of the pin is retracted with respect to an outer surface of the probe at which an opening of the reference socket is located both in the initial state and the pushed state. In other words, the abutting surface of the pin never projects with respect to the outer surface of the probe, thereby ensuring that the abutting surface is shielded by the metal body and also protected from environmental influences. In an embodiment, the abutting surface is always retracted with respect to the outer surface in the initial state as well in the pushed state. The pushed state relates to the position when the pin is moved out of its initial state, e.g. by the device under test, specifically the part of the device under test, which is contacted by the abutting surface.

In an embodiment, the outer surface at which the opening of the reference socket is located may relate to a proximate end of the probe.

Another aspect provides, for example, that the probe has a spring that interacts with this pin such that the pin is movably located within the probe. The spring ensures that the pin is spring-loaded. Hence, the pin may also be called spring pin as the pin is spring-loaded. The spring forces the pin into its initial state, e.g. when the probe is not used anymore. Once the probe contacts the device under test, a pin tip of the device under test may move the pin relatively with respect to the metal body against the spring force of the spring. The spring force ensures that the abutting surface contacts the pin tip of the device under test in a forced manner. Hence, good matching and electrical contact of the probe is obtained when probing the device under test.

For instance, the probe has a shell in which the spring is located and in which the pin is at least partly located. The shell provides a stop for the spring and/or the movable pin. Moreover, the shell is used for guiding the pin when the pin is moved.

A further aspect provides, for example, that the probe comprises an electrically isolating body member that accommodates the pin, thereby isolating the pin from the metal body. The electrically isolating body member surrounds the pin such that a (mechanical and electrical) contact between the pin and the metal body is avoided. The electrically isolating body member may comprise a passage for the pin. Thus, the pin can move along the passage within the electrically isolating body member. Furthermore, the part of the device under test that is contacted by the abutting surface may be inserted into the passage while pushing back the pin along the passage when the device under test is probed.

In an embodiment, the pin is pushed back into the shell against the spring force of the spring located in the shell.

In an embodiment, the electrical contact realized between the pin, for example its abutting surface, and the pin tip of the device under test is electrically isolated from the metal body due to the electrically isolating body member that provides the passage in which the electrical contact is realized.

In an embodiment, the probe may comprise an electrically isolating end part that is located at and end portion of the probe at which an opening of the reference socket is provided. The end portion of the probe is used for probing the device under test as the opening of the reference socket is provided at the respective end portion. The end portion may be associated with the proximate end of the probe. The electrically isolating end part ensures that the end portion of the probe, namely its proximate end, is electrically isolated with respect to the metal body. The electrically isolating end part ensures that other pin tips of the device under test than the one contacting the abutting surface and inserted into the reference socket are electrically isolated.

For instance, the electrically isolating end part is a cap that is placed on the metal body so as to circumference the metal body at least partly. This ensures that the metal body is electrically isolated by the end part used as the cap at the proximate end of the probe.

In an embodiment, the electrically isolating end part may have at least one protrusion that extends in parallel to the pin. An electrically isolating body member overlaps with the at least one protrusion at least partly. Therefore, sufficient clearance and creepage distances are obtained such that no unintended electrical connection can be realized between the pin and the metal body. In an embodiment, the electrically isolating body member that overlaps with the at least one protrusion is the one that provides the passage along which the pin can be moved.

In an embodiment, the at least one protrusion may be ring-shaped. Thus, the at least one protrusion circumferences the movable pin at least partly.

In an embodiment, the at least one protrusion is integrally formed with the electrically isolating end part. In other words, the protrusion and the electrically isolating end part are made in one piece, e.g. made of the same material and during a single manufacturing step.

In an embodiment, the probe may comprise a sealing made of an electrically non-conductive material. The sealing may be placed on the electrically isolating end part, for example within the at least one protrusion. The sealing may be ring-shaped as well such that it can be placed into the at least one ring-shaped protrusion. The sealing is made of the electrically non-conductive material such that the sealing is enabled to contact the pin tip of the device under test when the device under test is probed. The sealing may be dimensioned such that a clamping of the pin tip of the device under test is realized when probing the device under test. The clamping ensures that the probe does not tilt with respect to the device under test, for example in case the spring is provided since the spring force impinges the pin towards the pin tip of the device under test, thereby causing a releasing rather than a contacting. Since however the sealing clamps the pin tip of the device under test, the respective forces can be compensated (at least partly). In an embodiment, an improved haptic feedback is ensured for the user of the probe.

In an embodiment, the sealing may have an inner diameter between 0.5 mm and 1.5 mm and a thickness between 0.2 mm and 1 mm.

In an embodiment, a coaxial arrangement is provided, as the ring-shaped protrusion, the pin, the passage and/or the ring-shaped sealing share a common center axis.

For instance, the sealing is located between an electrically isolating end part, for instance the cap mentioned above, and an electrically isolating body member that accommodates the pin, for instance the electrically isolating body member providing the passage for the pin.

Alternatively or additionally, the sealing is placed within a ring-shaped protrusion of an electrically isolating end part, which extends in parallel to the pin. As mentioned above, the ring-shaped protrusion may hold the sealing in its position.

In an embodiment, the sealing may be a ring that has an inner diameter which is smaller than a diameter of the main portion of the pin and/or larger than the diameter of the tip of the pin. The pin may have a main portion as well as tip, wherein the tip is smaller than the main portion. Hence, the pin may narrow towards its tip. The sealing relates to a stop for the pin, as the main portion of the pin will be stopped at the sealing due to its larger diameter. The tip of the pin however can move through an opening provided by the ring-shaped sealing. Generally, the tip of the pin can be used as an interface.

For instance, a separately formed penetrator pin is provided that is capable of being placed on the pin. Particularity, the separately formed penetrator pin can be placed on the tip of the pin, which is used as the interface for the separately formed penetrator pin. For this purpose, the separately formed penetrator pin may have a socket that interacts with the tip of the pin so as to provide an extension of the pin. The penetrator pin may also be used in case a larger distance is provided between the probe and the device under test that cannot be overcome. The penetrator pin however can be realized small such that input capacitance are not influenced in a negative manner.

According to a further aspect, for example, a separately formed reference pin is provided that is capable of being inserted into the reference socket. The separately formed reference pin can be used for contacting different devices under tests. In other words, the separately formed reference pin can be used as an adapter in case of a differently formed device under test.

In an embodiment, the separately formed reference pin as well as the separately formed penetrator pin may be used in case of a device under test to be probed that does not provide pins or posts to be contacted.

In an embodiment, the separately formed reference pin may be flexible and/or spring-loaded. A good electrical contact can be realized due to the spring force provided that pushes the separately formed reference pin against the device under test and/or into the reference socket. The flexibility of the separately formed reference pin may be used for contacting the device under test in case of a contact that cannot be reached or accessed easily. The flexibility may ensure to increase the distance to the pin or the penetrator pin. In general, a larger distance between the reference pin and the signal pin can be obtained due to the flexibility.

Alternatively or additionally, the separately formed reference pin comprises a first pin part and a second pin part, wherein the first and second pin parts are displaced with respect to each other in a direction perpendicular to an extension direction of the first pin part and/or the second pin part. The pin parts may run in parallel with each other. However, the second pin part may also be inclined with respect to the first pin part, namely inclined by an angle different to zero degrees.

In an embodiment, the pin parts may be connected with each other by a connecting member, e.g. a plate. The connecting member may be flexible or rigid, for instance made of an electrically conductive material, e.g. a metal like aluminum or stainless steel.

In an embodiment, the pin parts (and the pin) may be made of a metal, e.g. copper beryllium (CuBe2).

In an embodiment, the reference socket may be provided in a concavity of the metal body. Thus, the reference pin, namely the separately formed reference pin acting as adapter or a pin tip of the device under test acting as the reference pin, may be introduced into the concavity of the metal body such that they are clamped in the concavity, namely the reference socket.

In an embodiment, the probe may also comprise a printed circuit board. The pin is at least indirectly connected with the printed circuit board in a signal-transmitting manner such that the signal is forwarded to the printed circuit board for being processed by the printed circuit board. A processing circuit may be provided on the printed circuit board, which processes the signal received via the pin accordingly. The processing circuit may comprise at least one resistor and/or at least one capacitor, e.g. RC parts. For instance, an RC circuit module is implemented on the printed circuit board.

In an embodiment, the pin and the reference socket may be made by an electrically conductive material.

In an embodiment, the reference socket may be part of a pre-fabricated socket unit that is pressed with the metal body, thereby establishing electrical and mechanical contact between the metal body and the pre-fabricated socket unit that comprises the reference socket. Thus, the probe can be manufactured in an easy and cost-efficient manner.

Hence, the probe may comprise at least two parts, namely the pre-fabricated socket unit and a probe base having the metal body and the pin that is arranged electrically isolated from the metal body. These parts are connected with each other to establish the probe.

Embodiments of the present disclosure also provide a method of manufacturing a probe for measuring a signal and a reference signal. The method comprises:

Providing a probe base having a metal body and a pin that is electrically isolated from the metal body, Providing a pre-fabricated socket unit having a reference socket, wherein the pre-fabricated socket unit is separately formed with respect to the metal body, and Pressing the pre-fabricated socket unit with the metal body, thereby establishing electrical and mechanical contact between the metal body and the pre-fabricated socket unit that comprises the reference socket.

In an embodiment, the probe can be manufactured easily due to the two separately formed parts, namely the probe base and the pre-fabricated socket unit, which are pressed with each other in order to realize the mechanical and electrical contact between the pre-fabricated socket unit and the metal body simultaneously.

In an embodiment, the pin that is arranged electrically isolated from the metal body within the probe base may have the abutting surface that is capable of contacting a device under test for probing purposes.

In an embodiment, the pre-fabricated socket unit may further comprise a post that is pressed into the metal body so as to realize the electrical and mechanical connection.

An aspect provides, for example, that the pre-fabricated socket unit is pressed with the metal body from a face side of the probe to which an abutting surface of the pin is facing, wherein the abutting surface is capable of contacting a device under test. Therefore, the probe can be manufactured from the respective side of the probe via which the probing takes place, namely the proximate end.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
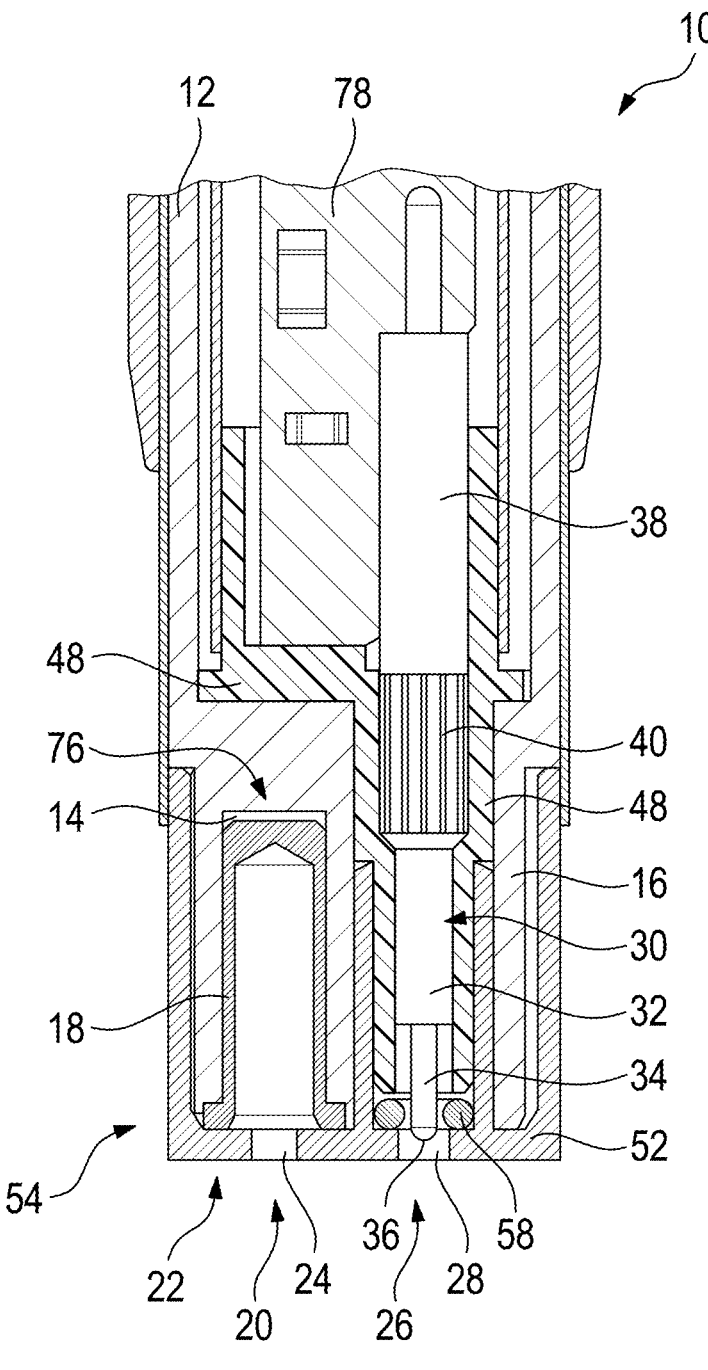
FIG. 1 schematically shows an overview of a probe according to an embodiment of the present disclosure, FIG. 2 schematically shows the probe of FIG. 1 when establishing a probe contact with a device under test.

In FIG. 1, a probe 10 for measuring a signal and a reference signal is shown. In the embodiment of FIG. 1, the probe 10 comprises a probe base 12 as well as a pre-fabricated socket unit 14 that is connected with the probe base 12 as we will be described later with reference to the manufacturing method shown in FIG. 8.

As shown in FIG. 1, the probe 10 has a metal body 16 as well as a reference socket 18 that is electrically connected with the metal body 16. The metal body 16 is part of the probe base 12, whereas the reference socket 18 is part of the pre-fabricated socket unit 14. The reference socket 18 is associated with a reference interface 20 that is located at an outer surface 22 of the probe 10 at a proximate end of the probe 10. The reference interface 20 has an opening 24 for receiving a part of a device under test as described later with reference to FIGS. 2 and 3.

In addition to the reference interface 20, the probe 12 also has a signal interface 26 that is associated with an opening 28 located at the same outer surface 22 at the proximate end of the probe 10. The signal interface 26 comprises a pin 30 that is movably located within the probe 10. The pin 30 has a main portion 32 as well as a tip 34 at which an abutting surface 36 is provided that faces towards the opening 28 of the signal interface 26. As assembled, the pin 30 is placed within a shell 38 that accommodates a spring 40 such that the pin 30 can be moved against the spring force of the spring 40 when probing a device under test 42 as shown in FIGS. 2 and 3.

Figure 2:
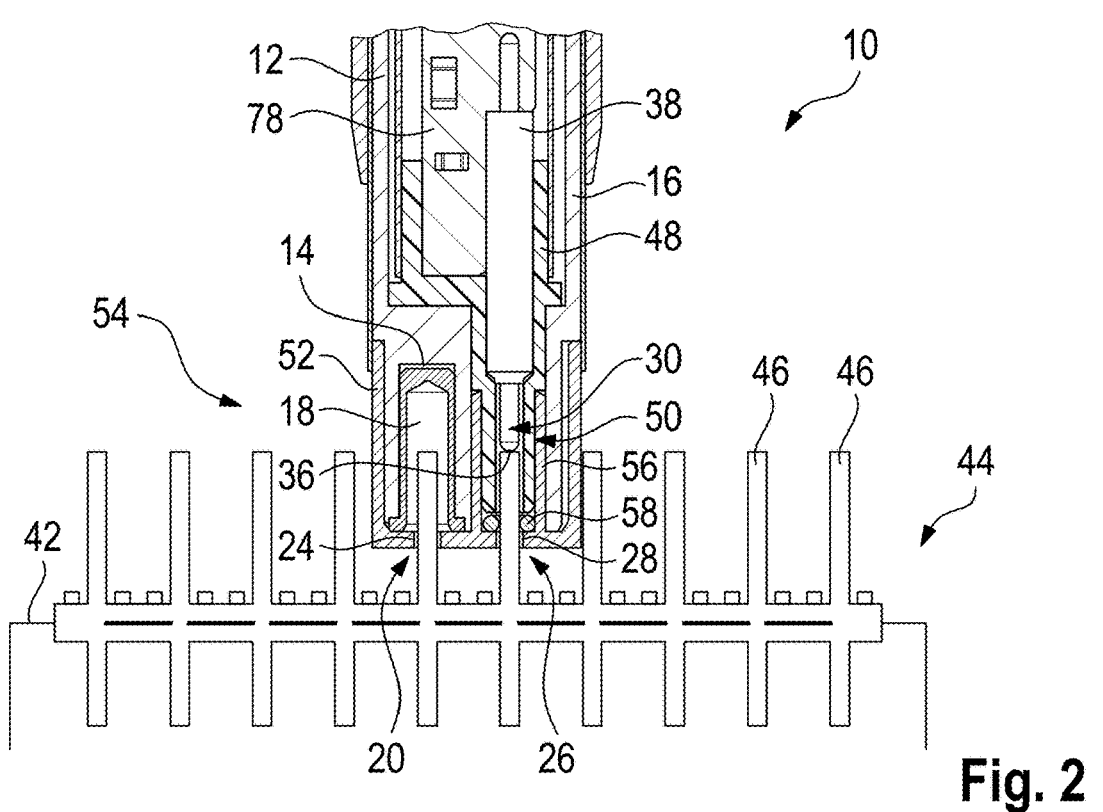

Turning to FIG. 2, the device under test 42 has a pin connector 44 with several pin tips 46. One of these pin tips 46 interacts with the reference socket 18 while being inserted into the reference socket 18, whereas another pin tip 46 interacts with the pin 30, for example its abutting surface 36.

Figure 3:
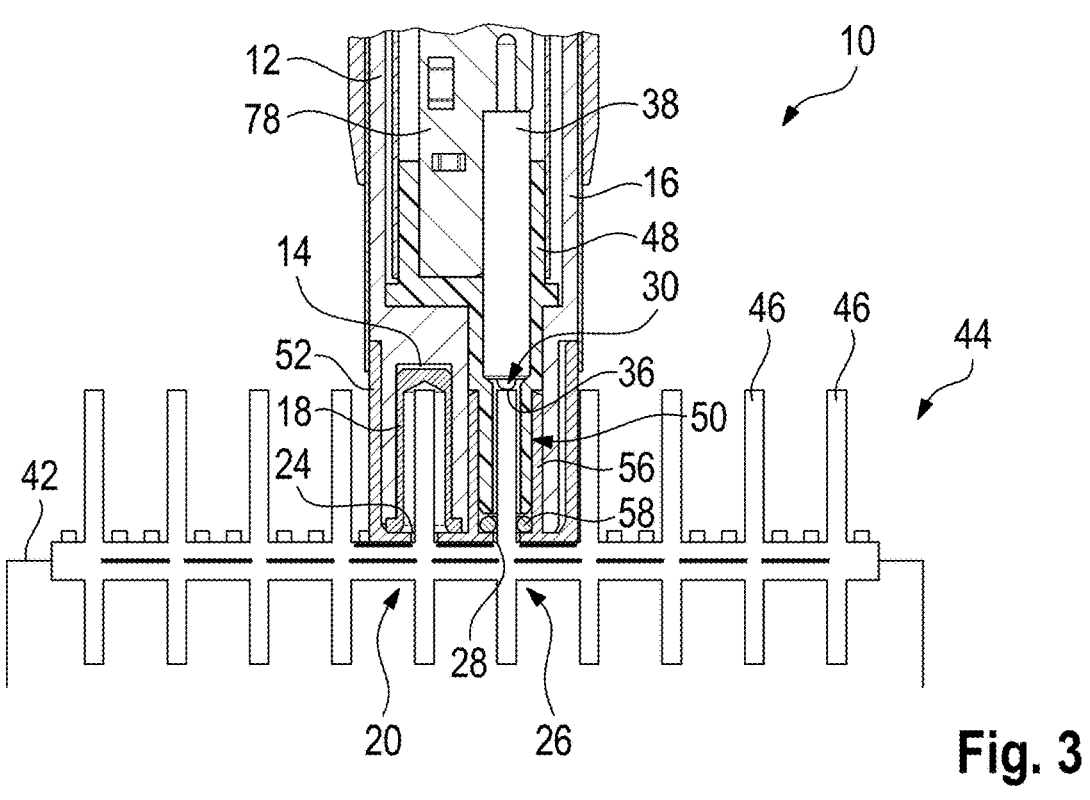
FIG. 3 shows the probe of FIGS. 1 and 2 when the probe contact is established with the device under test, FIG. 4 schematically shows the probe of FIGS. 1-3 with additionally separately formed adapter pins, FIG. 5 schematically shows a reference pin according to a first embodiment, FIG. 6 schematically shows the reference pin according to a second embodiment, FIG. 7 schematically shows the reference pin according to a third embodiment, and FIG. 8 schematically shows an overview of a method of manufacturing a probe according to an embodiment of the present disclosure.

As shown in FIGS. 1-3, the pin 30 is moved against the spring force of the spring 40 when the device under test 42 is probed by the probe 10, namely when the probe 10 is put on the device under test 42, for example the pin connector 44, e.g. the pin tips 46.

In FIG. 3, the probe 10 is fully placed on the device on the test 42 such that the pin 30 is completely pushed backwards against the spring force of the spring 40. The spring force ensures that a good electrical contact between the abutting surface 36 and the corresponding pin tip 46 of the device under test 42 is obtained such that accurate measurement results can be obtained.

In the embodiment of FIGS. 1-3, the probe 10 also comprises an electrically isolating body member 48 that ensures electrical isolation of the pin 30 from the metal body 16, thereby avoiding a short circuit between the pin 30 and the reference socket 18 that is electrically connected with the metal body 16. In the embodiment shown, the electrically isolating body member 48 provides a passage 50 along which the pin 30 can be moved. In addition, the pin tip 46 of the device under test 42 can be inserted into the passage 50 as shown in FIGS. 2 and 3, wherein the pin tip 46 moves along the passage 50 when the probe 10 is placed onto the device under test 42.

In the embodiment of FIGS. 1-3, the probe 10 also comprises an electrically isolating end part 52 that is formed as a cap and partially surrounds the metal body 16 within an end portion 54 of the probe 10, namely the proximate end of the probe 10, which is used for probing the device under test

42. The electrically isolating end part 52 has two openings that are aligned with the openings 24, 28 of the interfaces 20, 26 such that the pin tips 46 of the device under test 42 can be inserted through the electrically isolating end part 52 in order to interact with the reference socket 18 and the pin 30, for example its abutting surface 36.

In an embodiment, the electrically isolating end part 52 further comprises at least one protrusion 56 that extends in parallel to the pin 30. The protrusion 56 may be ring-shaped so as to circumference the pin 30 with a certain distance. Hence, a ring-shaped space is provided between the pin 30 and the protrusion 56, which is partly filled by the electrically isolating body member 48.

In an embodiment, the at least one protrusion 56 may further accommodate a sealing 58 that is placed on a bottom of the electrically isolating end part 52 while being laterally limited by the at least one (ring-shaped) protrusion 56. As shown in FIGS. 1-3, the sealing 58 is pressed between the electrically isolating end part 52 and the electrically isolating body member 48 such that the position of the sealing 58 is fixed. Consequently, the entire ring-shaped space between the pin 30 and the protrusion 56 is filled by the sealing 58 and the electrically isolating body member 48.

In an embodiment, the electrically isolating body member 48 and the electrically isolating end part 52, for example its protrusion 56, overlap with each other at least partly such that sufficient clearance and creepage distances are ensured.

In an embodiment, the ring-shaped sealing 58 has a diameter that ensures that the pin tip 46 of the device under test 42 can be moved through an opening of the sealing 58, whereas the pin 30 cannot be moved completely through the opening of the sealing 58. When the pin tip 46 of the device under test 42 is moved through the opening of the ring-shaped sealing 58, a clamping force applies to the pin tip 46. In other words, the respective diameters, namely the inner diameter of the sealing 58 and the outer diameter of the pin tip 46, substantially match with each other so as to ensure the clamping.

Generally, the pin 30 has an initial state (shown in FIG. 1) and at least one pushed state (shown in FIGS. 2 and 3) into which the pin 30 is pushed when the probe 10 probes the device under test 42, e.g. when the abutting surface 36 contacts a part of the device under test 42 during the probing. In FIG. 3, the ultimate pushed state of the pin 30 is shown.

From FIGS. 1 to 3, it should be understood that the abutting surface 36 of the pin 30 is always retracted with respect to the outer surface 22 of the probe 10, namely the face side at the proximate end, e.g. the surface at which the opening 24 associated with the reference socket 18 is located.

Figure 4:
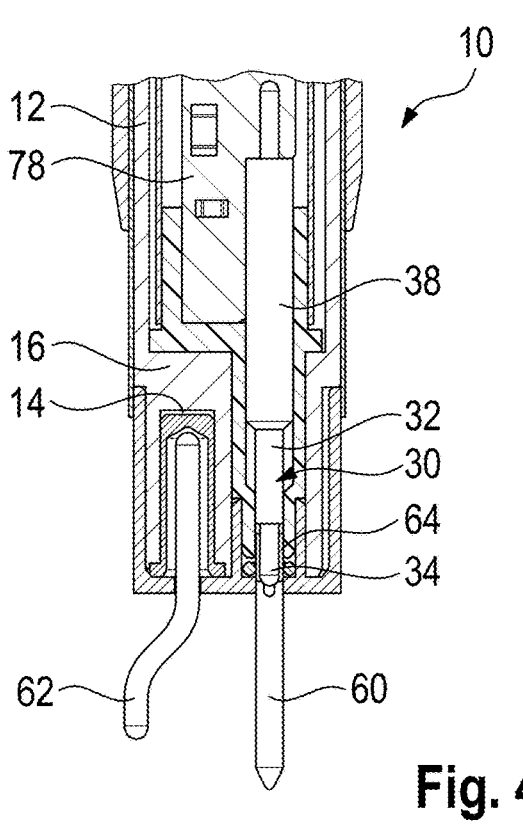

In FIG. 4, the probe 10 of FIGS. 1, 2, 3 is shown, wherein a separately formed penetrator pin 60 as well as a separately formed reference pin 62 are provided which are used as adapters for the probe 10. In an embodiment, the separately formed penetrator pin 60 has a socket 64 at an interface end via which the separately formed penetrator pin 60 is placed on the tip 34 of the pin 30. Thus, differently shaped devices under test can be probed appropriately, for example devices under test having no pin connector or pin tips as shown in FIGS. 2 and 3.

In an embodiment, the separately formed reference pin 62 may be a flexible reference pin as shown in FIG. 4. Thus, the reference pin 62 can be bent in a certain way in order to ensure proper contacting of the device under test. In addition, the distance between a reference contact and a signal contact can be increased when bending the separately formed reference pin 62 accordingly.

Figure 5:
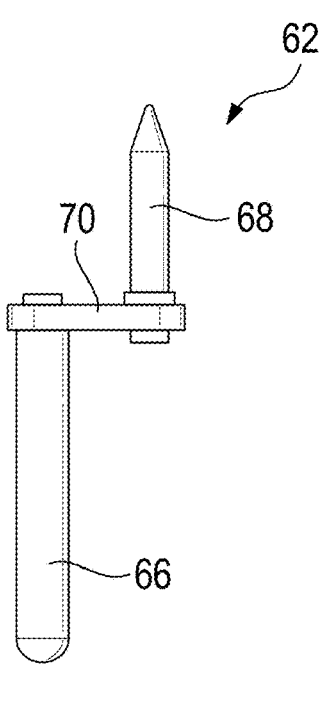
Figure 6:
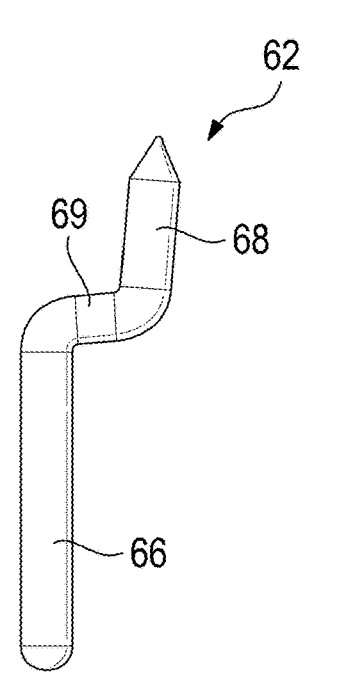
Figure 7:
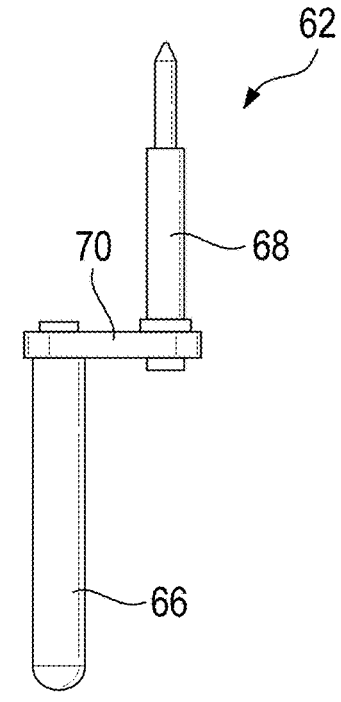

Alternatively, the separately formed reference pin 62 may comprise a first pin part 66 as well as a second pin part 68 which are displaced with respect to each other, for example in a direction perpendicular to an extension direction of the first pin part 66 and/or the second pin part 68, as shown in FIGS. 5-7. The pin parts 66, 68 may run in parallel to each other as shown in FIGS. 5 and 7. However, the pin parts 66, 68 may also be inclined with respect to each other as shown in FIG. 6.

As shown in FIG. 6, the pin parts 66, 68 may relate to integrally formed portions that are connected with each other via an intermediate portion 69 that runs perpendicular with respect to the extension direction of the first pin part 66 and/or the second pin part 68. Hence, the entire reference pin 62 may be integrally formed.

Alternatively, the pin parts 66, 68 are connected with each other via a separately formed connecting member 70 like a plate as shown in FIGS. 5 and 7. In an embodiment, the connecting member 70 may be a rigid such that the reference pin 62 is not flexible. Alternatively, a flexibility of the reference pin 62 may be provided by a flexible connecting member 70.

FIG. 7 depicts that at least one pin part, for example the second pin part 68, may be spring-loaded. In other words, the second spring part 68 may comprise a shell and a pin located within the shell such that the pin is movably located within the shell, for instance by a spring element located within the shell.

Figure 8:
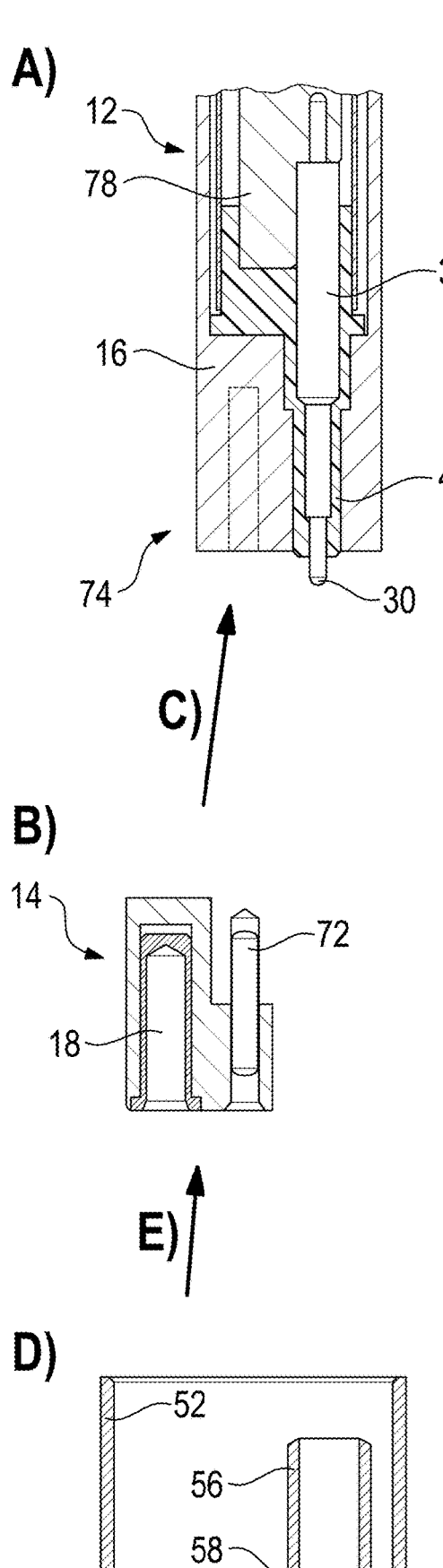
Figure 8:
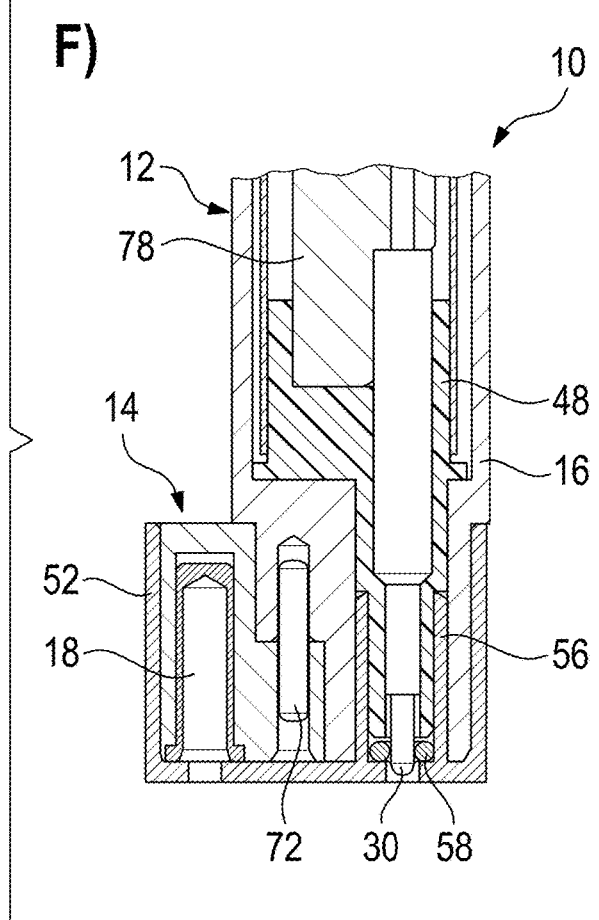

In FIG. 8, an overview of an example manufacturing process for manufacturing the probe 10 is shown.

In a first step A), the probe base 12 is provided that comprises the metal body 16. The probe base 12 also comprises the pin 30 that is electrically isolated from the metal body 16 by the electrically isolating body member 48.

In a second step B), the pre-fabricated socket unit 14 is provided that comprises the reference socket 18 as well as a post 72 for establishing a mechanical and electrical contact between the pre-fabricated socket unit 14 and the metal body 16 of the probe base 12.

In a third step C), the pre-fabricated socket unit 14 is pressed with the probe base 12, for example with the metal body 16, such that the electrical and mechanical contact between the reference socket 18 and the metal body 16 is established via the post 72.

In an embodiment, the post 72 is pressed into the metal body 16 as indicated by the dashed lines of FIG. 8, thereby establishing the electrical and mechanical contact between the pre-fabricated socket unit 14 and the metal body 16 such that the reference socket 18 is electrically connected with the metal body 16. Hence, a pre-fabricated probe 74 is obtained.

In a fourth step D), the electrically isolating end part 52 is provided that already accommodates the sealing 58 within the at least one protrusion 56.

In a fifth step E), the electrically isolating end part 52 is placed onto an end portion of the pre-fabricated probe 74 such that the sealing 58 is pressed between the bottom of the electrically isolating end part 52 and the electrically isolating body member 48.

Finally, the completely manufactured probe 10 is realized as shown in step F).

In an alternative embodiment, the pre-fabricated socket unit 14 does not comprise the post 72, but the reference socket 18 is pressed into the metal body 16.

For example, the metal body 16 may comprise a concavity 76 (shown in FIG. 1) for accommodating the reference socket 18 accordingly.

In an embodiment, the probe 10 also comprises a printed circuit board 78 used for at least (pre-)processing the signals probed by the probe 10. In an embodiment, the printed circuit board 78 may include a processor circuit attached or established thereon. In an embodiment, the printed circuit board includes an RC circuit module.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

Although the method and various embodiments thereof have been described as performing sequential steps, the claimed subject matter is not intended to be so limited. As nonlimiting examples, the described steps need not be performed in the described sequence and/or not all steps are required to perform the method. Moreover, embodiments are contemplated in which various steps are performed in parallel, in series, and/or a combination thereof. As such, one of ordinary skill will appreciate that such examples are within the scope of the claimed embodiments.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A probe for measuring a signal and a reference signal, wherein the probe comprises:
   a metal body that encompasses a reference socket, wherein the reference socket is in electrical connection with the metal body for measuring the reference signal;
   a pin arranged to be electrically isolated from the metal body, wherein the pin has an abutting surface capable of contacting a device under test; and
   an electrically isolating end part that is located at an end portion of the probe at which an opening of the reference socket is provided, wherein the electrically isolating end part has at least one protrusion that extends in parallel to the pin,
   wherein an electrically isolating body member at least partially overlaps with the at least one protrusion.

2. The probe according to claim 1, wherein the pin is movably located in the probe such that the pin has an initial state and a pushed state into which the pin is pushed.

3. The probe according to claim 2, wherein the abutting surface of the pin is retracted with respect to an outer surface of the probe at which an opening of the reference socket is located both in the initial state and the pushed state.

4. The probe according to claim 1, further comprising a spring that interacts with the pin such that the pin is movably located within the probe.

5. The probe according to claim 4, further comprising a shell in which the spring is located and in which the pin is at least partly located.

6. The probe according to claim 1, further comprising an electrically isolating body member that accommodates the pin, thereby isolating the pin from the metal body.

7. The probe according to claim 1, wherein the electrically isolating end part is a cap that is placed on the metal body so as to circumference the metal body at least partly.

8. The probe according to claim 1, wherein the at least one protrusion is ring-shaped.

9. The probe according to claim 1, further comprising a sealing made of an electrically non-conductive material.

10. The probe according to claim 9, wherein the sealing is located between an electrically isolating end part and an electrically isolating body member that accommodates the pin and/or wherein the sealing is placed within a ring-shaped protrusion of an electrically isolating end part, which extends in parallel to the pin.

11. The probe according to claim 9, wherein the sealing is a ring having an inner diameter that is smaller than a diameter of a main portion of the pin and/or larger than a diameter of a tip of the pin.

12. The probe according to claim 1, wherein a separately formed penetrator pin is provided that is capable of being placed on the pin.

13. The probe according to claim 1, wherein a separately formed reference pin is provided that is capable of being inserted into the reference socket.

14. The probe according to claim 13, wherein the separately formed reference pin is flexible and/or spring-loaded and/or wherein the separately formed reference pin comprises a first pin part and a second pin part, wherein the first and second pin parts are displaced with respect to each other in a direction perpendicular to an extension direction of the first pin part and/or the second pin part.

15. The probe according to claim 1, wherein the reference socket is provided in a concavity of the metal body.

16. The probe according to claim 1, wherein the reference socket is part of a pre-fabricated socket unit that is pressed with the metal body, thereby establishing electrical and mechanical contact between the metal body and the pre-fabricated socket unit that comprises the reference socket.

17. A probe for measuring a signal and a reference signal, the probe comprising:
   a metal body that encompasses a reference socket, wherein the reference socket is in electrical connection with the metal body for measuring the reference signal;
   a pin arranged to be electrically isolated from the metal body, wherein the pin has an abutting surface capable of contacting a device under test;
   a seal made of an electrically non-conductive material,
   wherein the seal is a ring having an inner diameter that is smaller than a diameter of a main portion of the pin or larger than a diameter of a tip of the pin, or
   wherein the seal is located between an electrically isolating end part and an electrically isolating body member that accommodates the pin, or
   wherein the sealing is placed within a ring-shaped protrusion of an electrically isolating end part, which extends in parallel to the pin.

18. A probe for measuring a signal and a reference signal, the probe comprising:
   a metal body that encompasses a reference socket, wherein the reference socket is in electrical connection with the metal body for measuring the reference signal;
   a pin arranged to be electrically isolated from the metal body, wherein the pin has an abutting surface capable of contacting a device under test;
   a spring that interacts with the pin such that the pin is movably located within the probe, wherein the pin has an initial state and a pushed state into which the pin is pushed when the device under test is probed by the probe; and
   a shell in which the spring is located and in which the pin is at least partly located such that the shell guides the movable pin when the pin is moved, and wherein the shell provides a stop for the spring or the movable pin.

* * * * *